(12) United States Patent
Shlepnev

(10) Patent No.: US 8,577,632 B2
(45) Date of Patent: Nov. 5, 2013

(54) SYSTEM AND METHOD FOR IDENTIFICATION OF COMPLEX PERMITTIVITY OF TRANSMISSION LINE DIELECTRIC

(76) Inventor: Yuriy Shlepnev, Las Vegas, NV (US)

( * ) Notice: Subject to any disclaimer, the term of this patent is extended or adjusted under 35 U.S.C. 154(b) by 367 days.

(21) Appl. No.: 13/009,541

(22) Filed: Jan. 19, 2011

(65) Prior Publication Data

US 2011/0178748 A1    Jul. 21, 2011

Related U.S. Application Data

(60) Provisional application No. 61/296,237, filed on Jan. 19, 2010.

(51) Int. Cl.
*G01R 27/32* (2006.01)
*G06F 19/00* (2011.01)

(52) U.S. Cl.
USPC .............................. 702/65; 324/637; 324/638

(58) Field of Classification Search
USPC ............ 702/65, 66, 71, 75, 76, 106; 324/638, 324/637; 434/195, 203, 204
See application file for complete search history.

(56) References Cited

U.S. PATENT DOCUMENTS

| | | | |
|---|---|---|---|
| 2,494,497 A | 1/1950 | Trapnell | |
| 2,699,757 A | 8/1959 | Webb | |
| 2,950,542 A | 8/1960 | Steelman | |
| 3,204,343 A | 9/1965 | Pollack | |
| 4,518,359 A | 5/1985 | Yaopsong | |
| 5,205,747 A | 4/1993 | Tan | |
| 5,297,965 A | 3/1994 | Manancero | |
| 6,056,553 A | 5/2000 | Huang | |
| 6,472,885 B1 * | 10/2002 | Green et al. | 324/638 |
| 6,873,162 B1 | 3/2005 | Bois et al. | |
| 7,059,861 B1 | 6/2006 | Baumgartner | |
| 7,495,454 B2 * | 2/2009 | Rivera | 324/638 |

OTHER PUBLICATIONS

Michael D. Janezic & Jeffrey A. Jargon, Complex Permittivity Determination from Propagation Constant Measurements, Feb. 1999, IEEE Microwave and Guided Wave Letters, vol. 2.

Maarten Cauwe & Johan De Baets, Broadband Material Parameter Characterization for Practical High-Speed Interconnects on Printed Circuit Board, Aug. 2008.

Frederick Declercq & Hendrik Rogier & Carla Hertleer, Permittivity and Loss Tangent Characterization for Garment Antennas Based on a New Matrix-Pencil Two-Line Method, Aug. 2008.

(Continued)

*Primary Examiner* — John H Le
(74) *Attorney, Agent, or Firm* — Sinorica, LLC

(57) ABSTRACT

A system and method for identification of complex permittivity associated with a transmission line dielectric is proposed. A network analyzer measures scattering parameters over a specified frequency band for at least two line segments of different length and substantially identical cross-section filled with a dielectric. A first engine determines non-reflective (generalized) modal scattering parameters of the difference segment based on the measured scattering parameters of two line segments. A second engine computes generalized modal scattering parameters of the line difference segment by solving Maxwell's equations for geometry of the line cross-section with a given frequency-dependent complex permittivity dielectric model. A third engine performs optimization by changing dielectric model parameters and model type until the computed and measured generalized modal scattering parameters match. The model that produces generalized modal S-parameters closest to the measured is the final dielectric model.

20 Claims, 5 Drawing Sheets

(56) References Cited

OTHER PUBLICATIONS

Yu. O. Shlepnev & B. V. Sestroretzkiy & V. Yu. Kustov, A New Approach to Modeling Arbitrary Transmission Lines, Journal of Communications Technology and Electronics, 1997.

Antonije R. Djordjevic, Radivoje M. Biljic, et al. Wideband Frequency-Domain Characterization of FR-4 and Time-Domain Causality, IEEE Transactions on Electromagnetic . . . , 2001.

Kimmo Kalervo Karkkainen & Ari Henrik Sihvola, et al., Effective Permittivity of Mixtures: Numerical Validation by the FDTD Method, IEEE Transactions on Geoscience . . . , 2000.

Donald C. Degroot & David K. Walker & Roger B. Marks, Impedance Mismatch Effects on Propagation Constant Measurements, 7th IEEE EPEP Conf. Dig., Napa, CA, Oct. 28-30, 1996.

Christophe Sqguinot & Patrick Kennis & Jean-Franicos Legier & et al., Multimode TRL—A New Concept in Microwave Measurements: Theory and Experimental Verification, May 1998.

* cited by examiner

SYSTEM AND METHOD FOR IDENTIFICATION OF COMPLEX PERMITTIVITY OF TRANSMISSION LINE DIELECTRIC

The current application claims a priority to the U.S. Provisional Patent application Ser. No. 61/296,237 filed on Jan. 19, 2010.

FIELD OF INVENTION

This invention relates generally to system and method for identification of complex permittivity associated with a transmission line dielectric. The system will make use of a network analyzer or equivalent instruments, two transmission line segments, and three engines used for calculations.

BACKGROUND OF THE INVENTION

Insulators or dielectrics are the media where signals propagate along the conductors of interconnects or transmission lines. Composite PCB and packaging dielectrics can be described with complex permittivity $\in = \in' - i \cdot \in''$ that exhibit strong dependency on frequency. Dielectric constant $\in'$ and loss tangent $$\tan\delta = \frac{\varepsilon''}{\varepsilon'}$$

are changing substantially over the frequency band of multi-gigabit signal spectrum. Dispersive dielectric models are required from DC up to 20 GHz for 10-20 Gb/s signals, and up to 40 GHz for 20-40 Gb/s signals for meaningful electromagnetic modeling of interconnects.

Multi-line technique with the diagonalization of T-matrices was recently used by many authors [1]-[5] to extract complex propagation constants (Gamma) for transmission lines and to derive complex permittivity from it. The basis of the methods with Gamma is the fact that the diagonal T-matrix in the multi-line TRL de-embedding contains only elements defined by the complex propagation constant and independent of the transmission line characteristic impedance [6]. The major problem with all dielectric identification techniques based on Gamma extraction is high sensitivity to measurement noise and imperfections in the test structures. The most difficult part of all approaches based on Gamma is the solution of the hyperbolic equations with the measurement noise, geometrical imperfections and large errors when the length difference between the line segments is half of wavelength. Identification of the propagation constant over a wide frequency band may require more than two line segments and additional short and open structures as suggested in [4]. In addition, even strip-line configurations do not provide an easy way to extract the propagation constant because of the dependency of Gamma on the conductor loss and dispersion, conductor roughness and high-frequency dispersion due to inhomogeneity of the dielectric layers adjacent to the strip in the PCB applications. The high-frequency dispersion is even more critical in cases if micro-strip structures are used for the identification (micro-strip structures may have advantage due to simpler transitions from probes or coaxial lines). Approximate formulas used to convert Gamma into dielectric constant may lead to different types of defects—such as overestimated loss tangent due to not accounting for the conductor roughness or plating. It means that simplified formula-based models or static and quasi-static solutions are practically useless above 3-5 GHz both for the dielectric parameters identification and for the compliance analysis. Here we use 3D full-wave electromagnetic analysis to compute generalized modal S-parameters of a line segment with all types of conductor and dielectric losses and dispersion included. The dielectric model is derived by comparison of the measured and computed generalized modal S-parameters. The proposed procedure is much less sensitive to the measurement noise and to geometrical differences between the samples.

SUMMARY OF INVENTION

As mentioned, the invention uses a 3D full-wave electromagnetic analysis to compute generalized modal S-parameters of a line segment with all types of conductor and dielectric losses and dispersion included. Any type of transmission line such as stripline, micro-strip, cable, coplanar waveguide can be used. The dielectric model is derived by comparison of the measured and computed generalized modal S-parameters. The proposed procedure is much less sensitive to the measurement noise and to geometrical differences between the samples.

The invention involves with computer-readable medium encoded with a program which, when loaded into a computer, makes the computer perform the steps for identification of complex permittivity of transmission line dielectric, the execution of program may be on a computer but also on any digital programmable hardware device or embedded processor within test instruments as a computer-implemented method for, comprising the steps of:

measuring scattering parameters (S-parameters) for at least two transmission line segments of different length and substantially identical cross-section filled with the investigated dielectric;

determining non-reflective, generalized modal scattering parameters of the said transmission line segment difference based on the measured S-parameters of two transmission line segments; and computing generalized modal scattering parameters of the line difference segment by solving Maxwell's equations for geometry of the line cross-section with a given frequency-dependent complex permittivity dielectric model;

wherein for the said generalized s-parameter model uses a given frequency-dependent complex permittivity dielectric model and guess values of the model parameters;

wherein the said measuring scattering parameters may be measured using network analyzer such as Vector Network Analyzer (VNA) or Time-Domain Network Analyzer (TDNA) or any other instrument or model that measures complex scattering parameters (S-parameters) of a multiport structure; wherein only the standard Short-Open-Load-Through (SOLT) calibration of VNA to the probe tips or to the coaxial connector is optional for the said measurement of S-parameters for the said two line segments;

wherein the said transmission line segments include at least two transmission line segments with substantially identical cross-section filled with investigated dielectric and the said two transmission line segments must have different length; wherein one said transmission line segment is shorter and another said transmission line segment is longer;

wherein the geometry of the cross-section and conductor parameters such as bulk resistivity and roughness must be known and both segments are equipped with either coaxial connectors or conductive probe pads to measure S-parameters over a given frequency range; and wherein the said transmission line segments may be one or multi-conductor strip or micro-strip line, coplanar waveguide or any other line type.

And further comprises the step of computing generalized modal S-parameters of line segment difference by solving Maxwell's equations for the transmission line cross-section with possibility to choose complex permittivity model for at least one dielectric in the line cross-section; and further constructing generalized modal S-parameters of line segment with length L, for a transmission line with N modes (N-conductor line), computed as equation:

$$\tilde{S}g(f, l) = \begin{bmatrix} 0 & Sm \\ Sm & 0 \end{bmatrix}, Sm = \text{diag}(e^{-\Gamma_n(f) \cdot l}, n = 1, \ldots, N)$$

where $\Gamma_n(f) = \alpha_n(f) + i \cdot \beta_n(f)$, n=1, ..., N are complex frequency-dependent propagation constant (Gamma) of the transmission line mode computed by solving Maxwell's equations;

wherein the said solution of the Maxwell's equations can be computed with any numerical method applied to the said line cross-section or to a line segment and such model include dispersive effects of conductors including skin-effect and effect of conductor roughness, high-frequency dispersion due to inhomogeneous dielectric and dispersive dielectric model equivalent to wideband Debye model or multi-pole Debye model.

And further comprises the step of selecting of dielectric model is to describe complex dielectric constant as causal and continuous function of frequency and not by just a set of points measured at different frequencies and computing a mixture model such as wideband Debye model or multi-pole Debye model with finite number of poles to fit an effective dielectric constant (DK) and Loss Tangent (LT) of a dielectric mixture using Multi-pole Debye model as a simple superposition of multiple one-pole Debye models using formula for the relative dielectric constant of such material can be expressed by equation (5)

$$\varepsilon(f) = \varepsilon(\infty) + \sum_{n=1}^{N} \frac{\Delta \varepsilon_n}{1 + i \frac{f}{f_m}}$$

wherein multi-pole Debye model with N real poles can be built by specifying N values for complex permittivity by fitting the specified data with real poles and the said model can be described by a set of the poles $f_{rn}$ and corresponding them residues $\Delta \in_n$, and the value at infinite frequency $\in(\infty)$.

And further comprising the steps of a) optimizating said dielectric model parameters and model type by adjusting dielectric model parameters and re-simulating the line segment to match magnitude and phase of the measured and simulated generalized modal transmission coefficients; and b) comparing the measured and computed generalized modal S-parameters, if they match according to a pre-defined criterion, the dielectric model is found, else if not matched, changing model parameters (or model type) and repeat steps a) and b).

DETAIL DESCRIPTIONS OF THE INVENTION

Invention Components

1) Network analyzer such as Vector Network Analyzer (VNA) or Time-Domain Network Analyzer—an apparatus that measures complex scattering parameters (S-parameters) of a multiport structure.

2) At least two transmission line segments with substantially identical cross-section filled with investigated dielectric. One or multi-conductor strip or microstrip line, coplanar waveguide or any other line type can be used. Two segments must have different length—one segment is shorter and another is longer. Geometry of the cross-section and conductor parameters such as bulk resistivity and roughness must be known. Both segments are equipped with either coaxial connectors or conductive probe pads to measure S-parameters over a given frequency range.

3) Procedures (first engine) of non-reflective or generalized modal S-parameters of line segment difference from two sets of S-parameters measured for two line segments.

4) Procedures (second engine) of non-reflective or generalized modal S-parameters of line segment difference by solving Maxwell's equations for the transmission line cross-section with possibility to choose complex permittivity model for at least one dielectric in the line cross-section.

5) Dielectric model parameters optimization procedure (third engine). Model parameters or model type are changing until the computed and measured generalized modal S-parameters match (root-mean square error is below some specified value). This procedure may be interactive or automatic optimization. The model that produces generalized modal S-parameters closest to the measured is the final dielectric model.

Invention Steps

1) Measure scattering parameters (S-parameters) for at least two transmission line segments of different length and substantially identical cross-section filled with the investigated dielectric.

2) Compute generalized modal S-parameters of the transmission line segment difference from the measured S-parameters.

3) Compute generalized modal S-parameter of line segment difference by solving Maxwell's equations for line cross-section with a dispersive complex permittivity model for investigated dielectric.

4) Compare the measured and computed generalized modal S-parameters.

If they match according to some criterion, the dielectric model is found (end).

If not matched, change model parameters (or model type) and repeat steps 3-4.

Measurement of Generalized Modal S-Parameters

Figure 1:
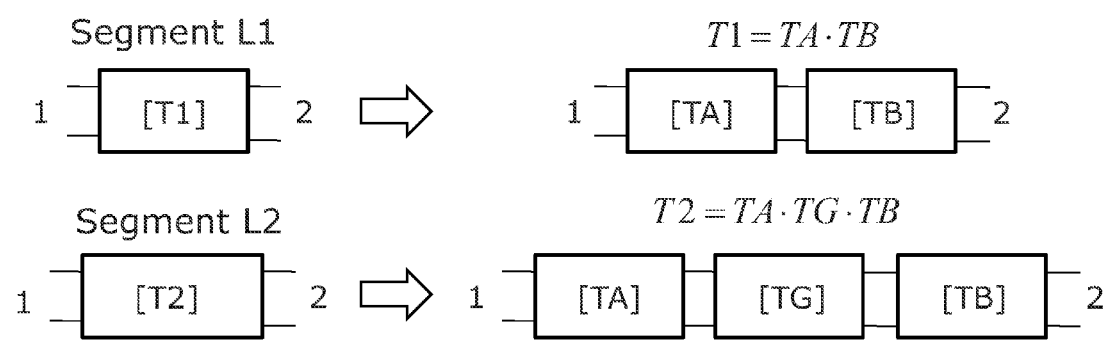
FIG. 1 is the factorization of T-matrices for two line segments.

First, we measure scattering parameters S1 of the short line segment with length L1 and S2 of a longer line segment with length L2 and convert them into the transfer scattering parameters T1 and T2 as described in [7] (can be done for multi-conductor transmission lines in general). Standard Short-Open-Load-Through (SOLT) calibration of VNA can be optionally used to perform this measurement and both S-matrices are normalized to common impedance (50 Ohm for instance). The T-matrices characterizing two line segments can be factored into two matrices TA and TB for the shorter line and into three matrices TA, TG and TB for the longer line as illustrated in FIG. 1.

It is assumed that the structures under investigation have substantially identical transitions on the left sides and on the right sides. Matrix TA describes the left transition with possible segment of line for both structures and TB describes the right transition. Matrices TA and TB are the transformers from the terminal space of the coaxial connectors to the modal space of the transmission line in the middle. Matrix TG is the T-matrix of the line segment in the modal space normalized to the characteristic impedances by definition [7]. TG is the diagonal matrix and can be expressed in general for N-mode or N-conductor transmission line as follows:

$$TG = \begin{bmatrix} Tm & 0 \\ 0 & (Tm)^{-1} \end{bmatrix}, Tm = \text{diag}(e^{-\Gamma_n(f) \cdot dL}, n = 1, \ldots, N) \quad (1)$$

where $\Gamma_n$, n=1, N–complex propagation constants of N transmission line modes, and dL=L2–L1 is the line segment difference. Because of $T2 \cdot T1^{-1} = TA \cdot TG \cdot TA^{-1}$, we can find the TG matrix by diagonalization of the product of T2 and inversed T1 as follows:

$$TG = \text{eigenvals}(T2 \cdot T1^{-1}) \quad (2)$$

Converting TG to the scattering matrix following [7], we obtain generalized modal S-matrix SG of the central line segment. SG for N-conductor transmission line can be expressed as:

$$SG = \begin{bmatrix} 0 & Sm \\ Sm & 0 \end{bmatrix}, Sm = Tm = \text{diag}(e^{-\Gamma_n(f) \cdot dL}, n = 1, \ldots, N) \quad (3)$$

Note that the complex propagation constants are not known at this point. All we know are complex numbers on the diagonal of the SG matrix blocks Sm derived from the measured S-parameters of two line segments. All other elements of the matrix SG are exactly zeroes. Computation of generalized modal S-matrices SG from the measured data (3) is all we need for the extraction of dielectric constant with the proposed method. No extraction of the complex propagation constants $\Gamma_n$, n=1, N as proposed in [1]-[5] is required. Computation of the propagation constant from the measured data requires solution of the hyperbolic equations for dielectric parameters identification and such computations are very sensitive to the measurement noise and to geometry imperfections. Instead, we will compare directly elements of the matrix SG (3) (measured generalized modal S-parameters) with computed generalized modal S-parameters. It requires only the diagonalization of the product of two matrices (2) that is relatively stable procedure.

Selection of Dielectric Model

The goal in the selection of dielectric model is to describe complex dielectric constant as causal and continuous function of frequency and not by just a set of points measured at different frequencies. Tabulated data with 2-3 frequency points cannot be considered as a final model because of it still needs an approximation by a causal function of frequency for the analysis of interconnects from DC to 20-40 GHz for instance.

Multiple researches, investigated composite PCB and packaging materials, observed decline of dielectric constant (DK) and relatively small growth of the loss tangent (LT) over a wide frequency band in the low-cost and high-loss dielectrics. A simple wideband Debye model with infinite number of poles [9] (sometime called Djordjevic-Sarkar model) can be used for description of such dielectrics. The model captures the physics of the composite dielectrics, it is causal and requires just two variables to describe it and to correlate it with the measurements. Frequency-dependent complex dielectric constant of the wideband Debye model [9] is defined as:

$$\varepsilon_{wd}(f) = \varepsilon_r(\infty) + \varepsilon_{rd} \cdot F_d(f), \quad (4)$$

$$F_d(f) = \frac{1}{(m_2 - m_1) \cdot \ln(10)} \cdot \ln\left[\frac{10^{m_2} + if}{10^{m_1} + if}\right]$$

Complete description of the wideband Debye model may be provided by DK and LT values at one frequency point and by the first and last pole frequencies, or by m1 and m2 in (4). Authors of [9] suggested to set $m_1=4$ and $m_2=12$ for the laminate materials and it seems like it does not need any adjustments in practical applications from 10 KHz to 1 THz.

The wideband Debye model is the simplest broad-band model for composite dielectric. Unfortunately, there is evidence that it is not suitable for the low-loss dielectrics with loss tangent below 0.01. The loss tangent for some high-performance dielectrics may grow from 0.001 to 0.01 from 1 MHz to 50 GHz and this growth cannot be captured by the wideband Debye model (4). Such growth rate does not correspond to the increase of the conductor loss due to the roughness as was pointed our earlier. The only possible explanation for this growth is smaller content of the epoxy or resin in the high-performance dielectrics. The mixture of molecules in the epoxy may produce multiple Debye poles and be approximated by the continuous poles of equation (4). Higher content of glass (or glass type dielectric) causes the growth of the loss tangent similar to the one-pole Debye model that is the best for the description of pure glass. In reality the mixture may be best described by a mixture models that combines models of the resin and glass. It is easy to construct such dielectric mixture models following the analysis provided in [10]. Though, such models may be difficult to construct without extensive knowledge about the dielectric mixture components (proportions and structure). A good alternative to the mixture model may be multi-pole Debye model [9] with finite number of poles. Such model can be used to fit an effective DK and LT of a dielectric mixture. Multi-pole Debye model is a simple superposition of multiple one-pole Debye models [9]. It assumes that a material has multiple relaxation or polarization frequencies (real poles). Formula for the relative dielectric constant of such material can be expressed as follows:

$$\varepsilon(f) = \varepsilon(\infty) + \sum_{n=1}^{N} \frac{\Delta\varepsilon_n}{1 + i\frac{f}{f_m}} \quad (5)$$

Multi-pole Debye model with N real poles can be built by specifying N values for complex permittivity by fitting the specified data with real poles. The final model can be described by a set of the poles $f_m$ and corresponding them residues $\Delta\varepsilon_n$, and the value at infinite frequency $\varepsilon(\infty)$. Multi-pole Debye model can be used for any PCB or packaging dielectric. The method is not restricted to just 2 possible models (4) and (5). Any other causal equation for a complex dielectric constant can be used in the identification procedure.

Computation of Generalized Modal S-Parameters

Generalized modal S-parameters of a transmission line segment with one mode (one-conductor line) can be expressed as:

$$\tilde{S}g(f, l) = \begin{bmatrix} 0 & \tilde{S}_{1,2} \\ \tilde{S}_{1,2} & 0 \end{bmatrix}, \tilde{S}_{1,2} = e^{-\Gamma(f) \cdot l} \quad (6)$$

where l is line segment length, and $\Gamma(f)=\alpha(f)+i\cdot\beta(f)$ is complex frequency-dependent propagation constant (Gamma) of the transmission line mode. Propagation constant can be found by solving Maxwell's equations with a numerical method. Generalized modal S-parameters of a transmission line segment with two modes (two-conductor transmission line) can be expressed as:

$$\tilde{S}g(f, l) = \begin{bmatrix} 0 & 0 & \tilde{S}_{1,3} & 0 \\ 0 & 0 & 0 & \tilde{S}_{2,4} \\ \tilde{S}_{1,3} & 0 & 0 & 0 \\ 0 & \tilde{S}_{2,4} & 0 & 0 \end{bmatrix}, \quad (7)$$

$$\tilde{S}_{1,3} = e^{-\Gamma_1(f) \cdot l}, \tilde{S}_{2,4} = e^{-\Gamma_2(f) \cdot l}$$

where $\Gamma_1(f)=\alpha_1(f)+i\cdot\beta_1(f)$ and $\Gamma_2(f)=\alpha_2(f)+i\cdot\beta_2(f)$ are complex propagation constants of two modes that can be found by solving Maxwell's equations for the line cross-section (even and odd or common and differential modes).

In general, for a transmission line with N modes (N-conductor line), generalized modal S-parameters of line segment with length l can be computed as:

$$\tilde{S}g(f, l) = \begin{bmatrix} 0 & Sm \\ Sm & 0 \end{bmatrix}, Sm = \text{diag}(e^{-\Gamma_n(f) \cdot l}, n = 1, \ldots, N) \quad (8)$$

where $\Gamma_n(f)=\alpha_n(f)+i\cdot\beta_n(f)$, n=1, ..., N are propagation constant computed by solving Maxwell's equations.

Common properties of the generalized modal S-parameters is absence of reflections (all reflection parameters are zeros) and absence of modal transformations (all mode transformation parameters are zeroes too). It reduces the number of complex functions for the dielectric identification from 2 to one in case of one-conductor line and from N*(N+1)/2 to just N in case of N-conductor line segment (from 10 to 2 in case of 2-conductor lines).

Solution of the Maxwell's equations can be done with any numerical method applied to the line cross-section or to a line segment as suggested in [8]. Such model must include dispersive effects of conductors such as skin-effect and effect of conductor roughness, high-frequency dispersion due to inhomogeneous dielectric and dispersive dielectric model such as wideband Debye (4) or multi-pole Debye (5).

Identification of Dielectric Parameters

Before identification of the dielectric properties, it is important to verify all dimensions of the structures on the board and to define the surface roughness of the conductors. In particular, cross-sections of the transmission lines and length difference between two line pairs have to be accurately measured before the identification. The roughness can be physically measured and characterized by two parameters—RMS peak to valley distance and roughness factor. The dimensions of t-line cross-section with the impedance-controlled process may vary a little from sample to sample. Thus, just a few samples may be cross-sectioned and measured with a micrometer. With the Rdc of just strip and the known dimensions, the resistivity of the conductor can be computed. Conductor resistivity and RMS measurements of roughness and roughness factor make it possible to separate all metal losses with high confidence—it is impossible to identify the dielectric properties without such separation in the model. Note, that 2-3 um roughness gives large error in loss tangent (up to 50% or more in cases of low loss dielectrics) if not accounted for properly. The only unknown in the identification process must be the dielectric model parameters.

Overall, the dielectric identification can be performed as follows:

1) Measure S-parameters for two line segments S1 and S2—SOLT calibration of VNA to the probe tips or to the coaxial connector is optional.
2) Transform S1 and S2 to the T-matrices T1 and T2 following [7], diagonalize the product of T1 and inversed T2 as defined by (1) and (2) and compute generalized modal S-parameters SG (3) of the line difference.
3) Select dielectric model and guess values of the model parameters.
4) Simulate segment of line with the length equal to difference and compute generalize modal S-parameters $\tilde{S}g$ of the segment (modal propagation constants in (6)-(8) can be computed by solving Maxwell's equations for a line cross-section by a numerical method).
5) Adjust dielectric model parameters and re-simulate the line segment to match magnitude and phase of the measured and simulated modal transmission coefficients (optionally use numerical optimization of the dielectric model).

The only difficult part of the procedure is the reliable model that allows extraction of the generalized modal S-parameters with all important dispersion and loss effects included into the complex propagation constant. Frequency-domain full-wave solver such as Simbeor can be used to do it. The rest of the procedure can be easily implemented in Matlab or Mathcad and is also available as a standard feature in Simbeor software.

Practical Examples

Figure 2:
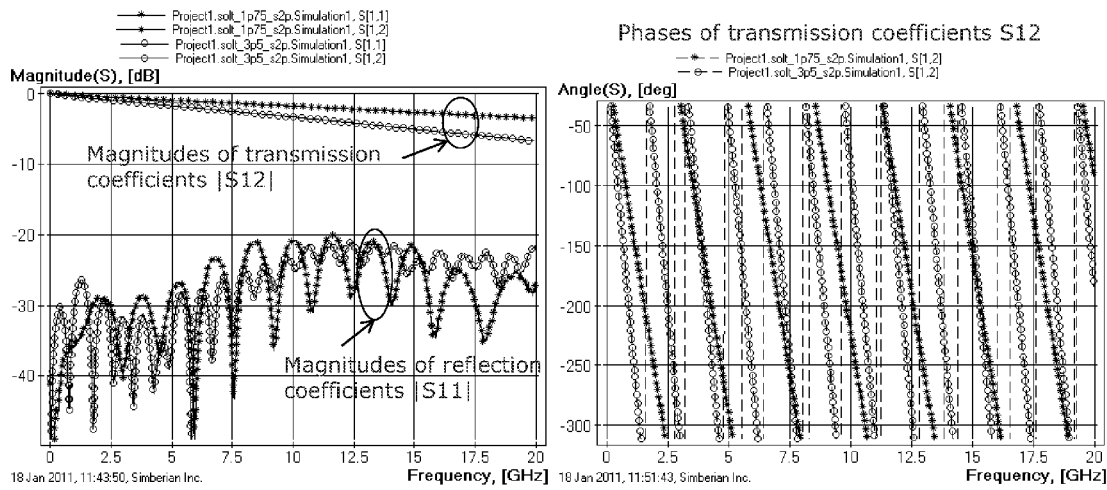
FIG. 2 is the magnitudes (left graph) and phases (right graph) of the reflection and transmission parameters of 1.75 inch micro-strip line segment (stars) and 3.5 inch micro-strip line segment (circles).

To illustrate the simplified dielectric properties identification procedure, we will use 1.75 inch (L1) and 3.5 inch (L2) microstrip line segments from PLRD-1 benchmark available from Teraspeed Consulting Group. Each microstrip segment is equipped with substantially identical transitions to coaxial connectors on low-cost high-loss FR4 dielectric. Micro-strip trace width is 17 mil, substrate thickness is 8.9 mil. Both plane and strip layers are 1.35 mil thick (1 Oz copper). Measured S-parameters for two through line segments L1 and L2 are shown in FIG. 2 (only SOLT calibration is used). Both lines have 3 independent S-parameters: S21=S12 due to the reciprocity and S11, S22. Despite on the input-to-output symmetry, S11 is not exactly equal to S22 that is typical for FR-4 boards due to the weave effect. There is actual physical unsymmetry in the structure, but it does not prevent the identification of effective dielectric parameters due to the consistency of the asymmetry between the samples.

Figure 3:
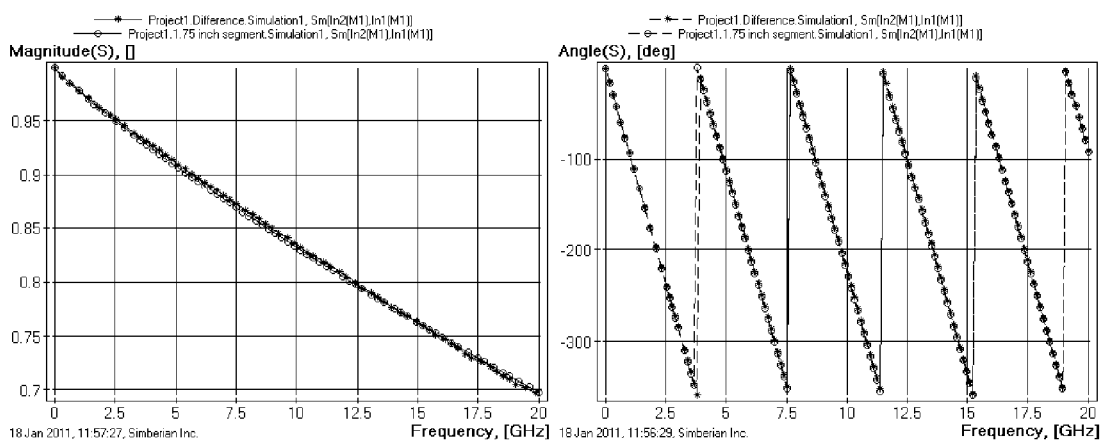
FIG. 3 is the magnitude (left graph) and phase (right graph) of the measured (stars) and simulated (circles) generalized modal S-parameters of 1.75-inch segment of micro-strip line.

Note that to use the measured S-parameters directly for the material parameters identification, we need to model transitions from/to the connectors or de-embed the transitions with the TRL—it is doable, but more difficult, error-prone and introduces more uncertainties in the process. Instead, we convert two sets of S-parameters into the generalized modal S-parameters of 1.75 inch line segment (difference between two lines) following equations (1)-(3). The reflection coefficient becomes exactly zero and the transmission coefficient is plotted by stars in FIG. 3. Due to the noise in the original dataset, we can observe small noise in the magnitude of the generalized modal transmission parameter. Note that the phase is less susceptible to the noise. This noise is the major problem in case if we use S12 to extract Gamma (complex propagation constant) and then use it directly to identify the dielectric parameters following methodology from [1]-[5]. Instead, we build numerical model of the line segment with guessed dielectric parameters, compute generalized S-parameters of 1.75 inch line segment and compare it with the measured generalized modal transmission. We use wide-band Debye dielectric model and after adjustment of DK to 4.05 and LT to 0.0195 at 1 GHz we get excellent correspondence between the measured and simulated generalized modal transmission parameters as shown in FIG. 3. The final ultra-broadband dielectric model in this case is the wideband Debye model with the frequency dependency of the DK and LT shown on the graph in FIG. 4.

Figure 4:
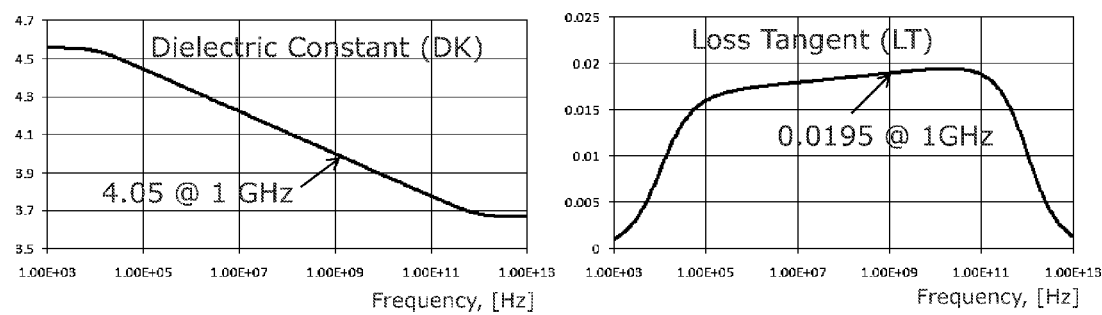
FIG. 4 is the final ultra-broadband dielectric model extracted from measured S-parameters for two micro-strip line segments.

As we can see from FIG. 4, DK changes about 15% from 1 MHz to 50 GHz. At the same time, the loss tangent changes only about 8%. This is typical for high-loss FR4-type dielectric case.

Figure 5:
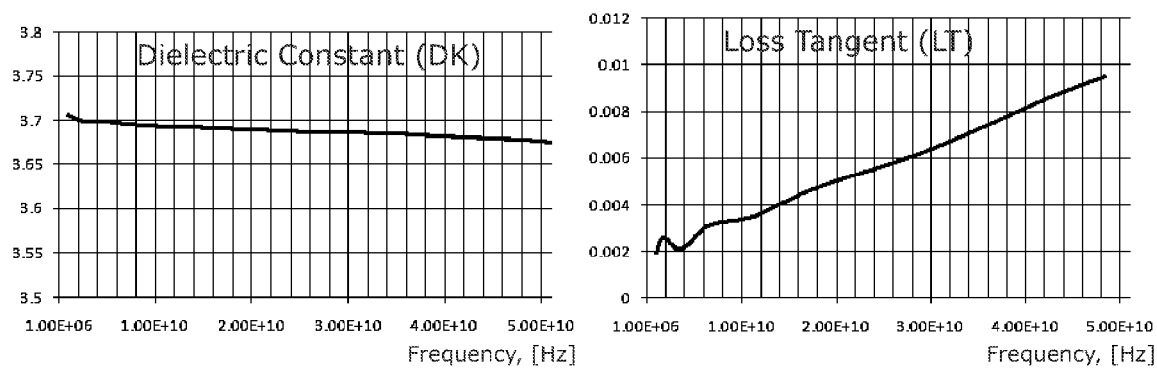
FIG. 5 is the frequency dependencies of dielectric constant (left graph) and loss tangent identified for a low-loss dielectric as 10-pole Debye model. DK is relatively flat, while loss tangent is growing almost linearly from 1 MHz to 50 GHz.

Investigation of a board with low dielectric loss (high-frequency or high-performance dielectrics) revealed that the dielectric constant does not changes as much as in the case of the high-loss FR4 dielectric, but the loss tangent may change more than 4 times over the frequency band of interest even if the roughness is accounted for. Wideband Debye model is not suitable in this case. Instead, multi-pole Debye model can be used. Some optimization of the poles locations and residue values may be required in that case. In addition, it is very important to characterize the roughness in this case. The final 10-pole dielectric model has dependency of the dielectric constant and loss tangent shown in FIG. 5. Note that multi-pole Debye model can be used to describe any PCB or packaging dielectric up to millimeter wavelengths.

Note that the method is not completely restricted to comparison of generalized modal S-parameters (GMS-parameters). Alternatively to GMS-parameters, complex propagation constant (Gamma) can be extracted from the measured GMS-parameters (3) and directly compared with the computed complex propagation constant (page 10). This is more error-prone due to necessity to extract Gamma from the measured data, but it is still a possibility. Extraction may be achieved by comparison of measured and simulated complex propagation constants.

The suggested procedure can be used to identify properties of conductive materials too. In case if dielectric models are known the procedure can be directly applied to identify parameters of models for conductive materials. We have used it recently to identify model parameters of nickel and for model parameters of rough copper.

Although illustrative embodiments have been described herein with reference to the accompanying drawings is exemplary of a preferred present invention, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

The invention claimed is:

1. A method of identifying complex permittivity of transmission line dielectric by executing computer-executable instructions stored on a nontransitory computer-readable medium, the method comprises the steps of:
    measuring scattering parameters (S-parameters) for at least two transmission line segments of different length and substantially identical cross-section filled with the investigated dielectric;
    determining non-reflective, generalized modal scattering parameters of the said transmission line segment difference based on the measured S-parameters of two transmission line segments;
    computing generalized modal scattering parameters of the line difference segment by solving Maxwell's equations for geometry of the line cross-section with a given frequency-dependent complex permittivity dielectric model;
    wherein for the said generalized s-parameter model uses a given frequency-dependent complex permittivity dielectric model and guess values of the model parameters; and
    changing dielectric model type and parameters until computed and measured generalized modal scattering parameters match.

2. The method of identifying complex permittivity of transmission line dielectric by executing computer-executable instructions stored on a nontransitory computer-readable medium of claim 1, wherein the said measuring scattering parameters may be measured using network analyzer including Vector Network Analyzer (VNA) or Time-Domain Network Analyzer (TDNA) or any other instrument or model that measures complex scattering parameters (S-parameters) of a multiport structure; wherein the standard Short-Open-Load-Through (SOLT) calibration of VNA to the probe tips or to the coaxial connector may be optionally used for the said measurement of S-parameters for the said two line segments.

3. The method of identifying complex permittivity of transmission line dielectric by executing computer-executable instructions stored on a nontransitory computer-readable medium of claim 2, wherein the said transmission line segments include at least two transmission line segments with substantially identical cross-section filled with investigated dielectric and the said two transmission line segments must have different length; wherein one said transmission line segment is shorter and another said transmission line segment is longer.

4. The method of identifying complex permittivity of transmission line dielectric by executing computer-executable instructions stored on a nontransitory computer-readable medium of claim 3, wherein the geometry of the cross-section and conductor parameters including bulk resistivity and roughness must be known and both segments are equipped with either coaxial connectors or conductive probe pads to measure S-parameters over a given frequency range; and wherein the said transmission line segments may be one or multi-conductor strip or micro-strip line, coplanar waveguide or any other line type.

5. The method of identifying complex permittivity of transmission line dielectric by executing computer-executable instructions stored on a nontransitory computer-readable medium of claim 4, further comprising the step of
computing generalized modal S-parameters of line segment difference by solving Maxwell's equations for the transmission line cross-section with possibility to choose complex permittivity model for at least one dielectric in the line cross-section; and further constructing generalized modal S-parameters of line segment with length L, for a transmission line with N modes (N-conductor line), computed as equation:

$$\tilde{S}g(f, l) = \begin{bmatrix} 0 & Sm \\ Sm & 0 \end{bmatrix}, Sm = \text{diag}(e^{-\Gamma_n(f)\cdot l}, n = 1, \ldots, N)$$

where $\Gamma(f) = \alpha_n(f) + i \cdot \beta_n(f)$, n=1, ..., N are complex frequency-dependent propagation constant (Gamma) of the transmission line mode computed by solving Maxwell's equations.

6. The method of identifying complex permittivity of transmission line dielectric by executing computer-executable instructions stored on a nontransitory computer-readable medium of claim 5, wherein the said solution of the Maxwell's equations can be computed with any numerical method applied to the said line cross-section or to a line segment and such model include dispersive effects of conductors including skin-effect and effect of conductor roughness, high-frequency dispersion due to inhomogeneous dielectric and dispersive dielectric model equivalent to wideband Debye model or multi-pole Debye model.

7. The method of identifying complex permittivity of transmission line dielectric by executing computer-executable instructions stored on a nontransitory computer-readable medium of claim 6, further comprising the step of
selecting of dielectric model is to describe complex dielectric constant as causal and continuous function of frequency and not by just a set of points measured at different frequencies and computing a mixture model including wideband Debye model or multi-pole Debye model with finite number of poles to fit an effective dielectric constant (DK) and Loss Tangent (LT) of a dielectric mixture using Multi-pole Debye model as a simple superposition of multiple one-pole Debye models using formula for the relative dielectric constant of such material can be expressed by equation:

$$\varepsilon(f) = \varepsilon(\infty) + \sum_{n=1}^{N} \frac{\Delta\varepsilon_n}{1 + i\frac{f}{f_m}}$$

wherein multi-pole Debye model with N real poles can be built by specifying N values for complex permittivity by fitting the specified data with real poles and the said model can be described by a set of the poles $f_{rn}$ and corresponding them residues $\Delta\varepsilon_n$ and the value at infinite frequency $\varepsilon(\infty)$.

8. The method of identifying complex permittivity of transmission line dielectric by executing computer-executable instructions stored on a nontransitory computer-readable medium of claim 7, further comprising the steps of
a) optimizating said dielectric model parameters and model type by adjusting dielectric model parameters and re-simulating the line segment to match magnitude and phase of the measured and simulated modal transmission coefficients; and
b) comparing the measured and computed generalized modal S-parameters, if they match according to a pre-defined criterion, the dielectric model is found, else if not matched, changing model parameters (or model type) and repeat steps a) and b).

9. A method of identifying complex permittivity of transmission line dielectric by executing computer-executable instructions stored on a nontransitory computer-readable medium, the method comprises the steps of:
a) obtaining measured scattering parameters (S-parameters) for at least two transmission line segments of different length and substantially identical cross-section filled with the investigated dielectric;
b) determining non-reflective, generalized modal scattering parameters of the said transmission line segment difference based on the measured S-parameters of two transmission line segments;
c) computing generalized modal scattering parameters of the line difference segment by solving Maxwell's equations for geometry of the line cross-section with a given frequency-dependent complex permittivity dielectric model;
wherein for the said generalized s-parameter model uses a given frequency-dependent complex permittivity dielectric model; and
d) matching computed and measured generalized modal scattering parameters by changing model type and parameters.

10. The method of identifying complex permittivity of transmission line dielectric by executing computer-executable instructions stored on a nontransitory computer-readable medium of claim 9, wherein the said measuring scattering parameters may be measured using network analyzer including Vector Network Analyzer (VNA) or Time-Domain Network Analyzer (TDNA) or any other instrument or model that measures complex scattering parameters (S-parameters) of a multiport structure; wherein the standard Short-Open-Load-Through (SOLT) calibration of VNA to the probe tips or to the coaxial connector may be optionally used for the said measurement of S-parameters for two line segments; and
the said transmission line segments include at least two transmission line segments with substantially identical cross-section filled with investigated dielectric and the said two transmission line segments must have different length; wherein one said transmission line segment is shorter and another said transmission line segment is longer.

11. The method of identifying complex permittivity of transmission line dielectric by executing computer-executable instructions stored on a nontransitory computer-readable medium of claim 10, further comprising the step of
computing generalized modal S-parameters of line segment difference by solving Maxwell's equations for the transmission line cross-section with possibility to choose complex permittivity model for at least one dielectric in the line cross-section;

and further constructing generalized modal S-parameters of line segment with length L, for a transmission line with N modes (N-conductor line), computed as equation:

$$\tilde{S}g(f, l) = \begin{bmatrix} 0 & Sm \\ Sm & 0 \end{bmatrix}, Sm = \text{diag}(e^{-\Gamma_n(f) \cdot l}, n = 1, \ldots, N)$$

where $\Gamma(f)=\alpha_n(f)+i\cdot\beta_n(f)$, $n=1, \ldots, N$ are complex frequency-dependent propagation constant (Gamma) of the transmission line mode computed by solving Maxwell's equations.

12. The method of identifying complex permittivity of transmission line dielectric by executing computer-executable instructions stored on a nontransitory computer-readable medium of claim 11, wherein the said solution of the Maxwell's equations can be computed with any numerical method applied to the said line cross-section or to a line segment and such model include dispersive effects of conductors including skin-effect and effect of conductor roughness, high-frequency dispersion due to inhomogeneous dielectric and dispersive dielectric model equivalent to wideband Debye model or multi-pole Debye model.

13. The method of identifying complex permittivity of transmission line dielectric by executing computer-executable instructions stored on a nontransitory computer-readable medium of claim 12, further comprising the step of
selecting of dielectric model is to describe complex dielectric constant as causal and continuous function of frequency and not by just a set of points measured at different frequencies and computing a mixture model including wideband Debye model or multi-pole Debye model with finite number of poles to fit an effective dielectric constant (DK) and Loss Tangent (LT) of a dielectric mixture using Multi-pole Debye model as a simple superposition of multiple one-pole Debye models using formula for the relative dielectric constant of such material can be expressed as equation:

$$\varepsilon(f) = \varepsilon(\infty) + \sum_{n=1}^{N} \frac{\Delta\varepsilon_n}{1 + i\dfrac{f}{f_m}}$$

Wherein multi-pole Debye model with N real poles can be built by specifying N values for complex permittivity by fitting the specified data with real poles and the said model can be described by a set of the poles $f_{rn}$ and corresponding them residues $\Delta\in_n$, and the value at infinite frequency $\in(\infty)$.

14. The method of identifying complex permittivity of transmission line dielectric by executing computer-executable instructions stored on a nontransitory computer-readable medium of claim 13, further comprising the steps of
d) optimizating said dielectric model parameters and model type by adjusting dielectric model parameters and re-simulating the line segment to match magnitude and phase of the measured and simulated modal transmission coefficients; and
e) comparing the measured and computed generalized modal S-parameters, if they match according to a predefined criterion, the dielectric model is found, else if not matched, changing model parameters (or model type) and repeat steps d) and e).

15. A method of identifying complex permittivity of transmission line dielectric by executing computer-executable instructions stored on a nontransitory computer-readable medium, the method comprises the steps of:
a) measuring scattering parameters (S-parameters) for at least two transmission line segments of different length and substantially identical cross-section filled with the investigated dielectric;
b) determining non-reflective, generalized modal scattering parameters of the said transmission line segment difference based on the measured S-parameters of two transmission line segments; and
c) computing generalized modal scattering parameters of the line difference segment by solving Maxwell's equations for geometry of the line cross-section with a given frequency-dependent complex permittivity dielectric model;
wherein for the said generalized s-parameter model uses a given frequency-dependent complex permittivity dielectric model and guess values of the model parameters, and
wherein the geometry of the cross-section and conductor parameters including bulk resistivity and roughness must be known and both segments are equipped with either coaxial connectors or conductive probe pads to measure S-parameters over a given frequency range; and
wherein the said transmission line segments may be one or multi-conductor strip or micro-strip line, coplanar waveguide or any other line type.

16. The method of identifying complex permittivity of transmission line dielectric by executing computer-executable instructions stored on a nontransitory computer-readable medium of claim 15, wherein the said measuring scattering parameters may be measured using network analyzer including Vector Network Analyzer (VNA) or Time-Domain Network Analyzer (TDNA) or any other instrument or model that measures complex scattering parameters (S-parameters) of a multiport structure; wherein only the standard Short-Open-Load-Through (SOLT) calibration of VNA to the probe tips or to the coaxial connector may be optionally used for the said measurement of S-parameters for two line segments; and
the transmission line segments include at least two transmission line segments with substantially identical cross-section filled with investigated dielectric and the said two transmission line segments must have different length; wherein one said transmission line segment is shorter and another said transmission line segment is longer.

17. The method of identifying complex permittivity of transmission line dielectric by executing computer-executable instructions stored on a nontransitory computer-readable medium of claim 16, further comprising the step of selecting of dielectric model is to describe complex dielectric constant as causal and continuous function of frequency and not by just a set of points measured at different frequencies and computing a mixture model including wideband Debye model or multi-pole Debye model with finite number of poles to fit an effective dielectric constant (DK) and Loss Tangent (LT) of a dielectric mixture using Multi-pole Debye model as a simple superposition of multiple one-pole Debye models using formula for the relative dielectric constant of such material can be expressed as equation:

$$\varepsilon(f) = \varepsilon(\infty) + \sum_{n=1}^{N} \frac{\Delta\varepsilon_n}{1 + i\dfrac{f}{f_{rn}}}$$

Wherein multi-pole Debye model with N real poles can be built by specifying N values for complex permittivity by fitting the specified data with real poles and the said model can be described by a set of the poles $f_{rn}$ and corresponding them residues $\Delta\varepsilon_n$, and the value at infinite frequency $\in(\infty)$.

18. The method of identifying complex permittivity of transmission line dielectric by executing computer-executable instructions stored on a nontransitory computer-readable medium of claim 17, further comprising the step of computing generalized modal S-parameters of line segment difference by solving Maxwell's equations for the transmission line cross-section with possibility to choose complex permittivity model for at least one dielectric in the line cross-section; and further constructing generalized modal S-parameters of line segment with length L, for a transmission line with N modes (N-conductor line), computed as equation:

$$\tilde{S}g(f, l) = \begin{bmatrix} 0 & Sm \\ Sm & 0 \end{bmatrix}, Sm = \mathrm{diag}(e^{-\Gamma_n(f)l}, n = 1, \ldots, N)$$

where $\Gamma(f) = \alpha_n(f) + i\cdot\beta_n(f)$, $n=1, \ldots, N$ are complex frequency-dependent propagation constant (Gamma) of the transmission line mode computed by solving Maxwell's equations.

19. The method of identifying complex permittivity of transmission line dielectric by executing computer-executable instructions stored on a nontransitory computer-readable medium of claim 18, wherein the said solution of the Maxwell's equations can be computed with any numerical method applied to the said line cross-section or to a line segment and such model include dispersive effects of conductors including skin-effect and effect of conductor roughness, high-frequency dispersion due to inhomogeneous dielectric and dispersive dielectric model equivalent to wideband Debye model or multi-pole Debye model.

20. The method of identifying complex permittivity of transmission line dielectric by executing computer-executable instructions stored on a nontransitory computer-readable medium of claim 19, further comprising the steps of d) optimizating said dielectric model parameters and model type by adjusting dielectric model parameters and re-simulating the line segment to match magnitude and phase of the measured and simulated modal transmission coefficients; and e) comparing the measured and computed generalized modal S-parameters, if they match according to a pre-defined criterion, the dielectric model is found, else if not matched, changing model parameters (or model type) and repeat steps d) and e).

\* \* \* \* \*